US006887749B2

(12) United States Patent
Noble et al.

(10) Patent No.: US 6,887,749 B2
(45) Date of Patent: *May 3, 2005

(54) MULTIPLE OXIDE THICKNESSES FOR MERGED MEMORY AND LOGIC APPLICATIONS

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 166 days.

This patent is subject to a terminal disclaimer.

(21) Appl. No.: 10/140,297

(22) Filed: May 6, 2002

(65) Prior Publication Data

US 2002/0127884 A1 Sep. 12, 2002

Related U.S. Application Data

(62) Division of application No. 09/386,185, filed on Aug. 31, 1999, now Pat. No. 6,383,871.

(51) Int. Cl.[7] .............................................. H01L 21/336
(52) U.S. Cl. ....................................... 438/198; 438/270
(58) Field of Search ............................... 438/198, 270, 438/275, 769, 770

(56) References Cited

U.S. PATENT DOCUMENTS

| | | | |
|---|---|---|---|
| 3,999,282 A | 12/1976 | Ono et al. ...................... | 29/571 |
| 4,466,178 A | 8/1984 | Soclof ......................... | 29/576 B |
| 4,651,188 A | 3/1987 | Hayashi et al. ................ | 357/38 |
| 4,667,215 A | 5/1987 | Kawamura et al. ............. | 357/38 |
| 4,768,076 A | 8/1988 | Aoki et al. .................... | 357/42 |
| 4,833,516 A | 5/1989 | Hwang et al. ............... | 357/23.6 |

(Continued)

OTHER PUBLICATIONS

Balk, P.., "Orientation Dependence of Built–In Surface Charge on Thermally Oxidized Silicon", *IEEE, 53,* (1965), pp. 2133–2134.

Carr, W..N. ,et al. , *In: MOS/LSI Design and Application,* McGraw–Hill Book Company, New York,(1972),pp. 37, 49–52.

Crowder, S..,et al. ,"Trade–offs in the Integration of High Performance Devices with Trench Capacitor DRAM", *Dig. Int. Electron Devices Meeting, Washington, D.C.,* (Dec. 1997),pp. 45–48.

Deal, B..E. ,et al. ,"Charateristics of the Surface–State Charge (Q) of Thermally Oxidized Silicon", *J. Electrochem. Soc.: Solid State Science,* (1967),pp. 266–274.

Hodges, D..A. ,et al. *,In: Analysis and Design of Digital Integrated Circuits, Second Edition,* McGraw–Hill, Inc., New York,(1988),p. 342–344.

(Continued)

*Primary Examiner*—Michael Tokar
*Assistant Examiner*—Lisa Kilday
(74) *Attorney, Agent, or Firm*—Schwegman, Lundberg, Woessner & Kluth, P.A.

(57) ABSTRACT

Methods are provided for fabricating multiple oxide thicknesses on a single silicon wafer. Methods are provided to form multiple gate oxide thicknesses on a single chip wherein the chip can include circuitry encompassing a range of technologies including but not limited to the memory and logic technologies. These methods can be used in conjunction with existing fabrication and processing techniques with minimal or no added complexity. Methods for forming a semiconductor device include forming a top layer of $SiO_2$ on a top surface of a silicon wafer. A trench layer of $SiO_2$ is also formed on a trench wall of the silicon wafer. The trench wall of the silicon wafer has a different order plane-orientation than the top surface. Additionally, the formation of the top and trench layers of $SiO_2$ are such that a thickness of the top layer is different from a thickness of the trench layer.

44 Claims, 9 Drawing Sheets

U.S. PATENT DOCUMENTS

| | | | |
|---|---|---|---|
| 4,857,986 A | 8/1989 | Kinugawa | 357/42 |
| 5,082,795 A | 1/1992 | Temple | 437/41 |
| 5,192,680 A * | 3/1993 | Naruse et al. | 438/505 |
| 5,196,722 A | 3/1993 | Bergendahl et al. | 257/304 |
| 5,364,810 A | 11/1994 | Kosa et al. | 437/52 |
| 5,371,383 A | 12/1994 | Miyata et al. | 257/77 |
| 5,583,368 A | 12/1996 | Kenney | 257/621 |
| 5,770,878 A | 6/1998 | Beasom | 257/330 |
| 5,801,089 A | 9/1998 | Kenney | 438/589 |
| 5,883,012 A | 3/1999 | Chiou et al. | 438/748 |
| 5,888,880 A | 3/1999 | Gardner et al. | 438/424 |
| 5,904,543 A | 5/1999 | Wang | 438/444 |
| 5,907,170 A | 5/1999 | Forbes et al. | 257/296 |
| 5,915,180 A | 6/1999 | Hara et al. | 438/270 |
| 5,991,225 A | 11/1999 | Forbes et al. | 365/230.06 |
| 5,998,263 A | 12/1999 | Sekariapuram et al. | 438/259 |
| 6,015,737 A | 1/2000 | Tokura et al. | 438/270 |
| 6,066,869 A | 5/2000 | Noble et al. | 257/296 |
| 6,072,209 A | 6/2000 | Noble et al. | 257/296 |
| 6,097,065 A | 8/2000 | Forbes et al. | 257/350 |
| 6,255,684 B1 | 7/2001 | Roesner et al. | 257/302 |
| 6,320,215 B1 * | 11/2001 | Bronner et al. | 257/301 |
| 6,358,867 B1 * | 3/2002 | Tews et al. | 438/771 |
| 6,362,494 B1 * | 3/2002 | Yagi | 257/76 |

OTHER PUBLICATIONS

Irene, E..A. ,"The Effects of Trace Amounts of Water on the Thermal Oxidation of Silicon in Oxygen", *Journal of the Electrochemical Society: Solid–State Science and Technology,* (1974),pp. 1613–1616.

Kim, Han–Soo.,et al. ,"The 600V Rating n–ch Trench IGBT with the Low Leakage Current and the High Channel Mobility Using the (101) Oriented Trench Sidewall", *IEEE,* Document No. 0–7803–3993–2/97,(1997),265–268.

King, Y..,et al. ,"Sub–5nm Multiple–Thickness Gate Oxide Technology Using Oxygen Implantation", *IEDM Technical Digest,* (1998),pp. 585–588.

Liu, C..T. ,et al. ,"Multiple Gate Oxide Thickness for 2GHz System–on–A–Chip Technologies", *IEDM Technical Digest,* (1998),pp. 589–592.

Peirret, R..F. , *Semiconductor Fundamentals, Second Edition,* Modular Series on Solid State Devices, vol. 1, Pierret , R.F., et al., (eds.), Addison–Wesley Publishing Co., Reading, MA,(Apr., 1989),p. 3–13.

Petti, C..J. ,et al. ,"Characterization of Surface Mobility on the Sidewalls of Dry–Etched Trenches", *IEEE IEDM '88,* (1988),104–107.

Sato, T..,et al. ,"Drift–Velocity Saturation of Holes in Si Inversion Layers", *J. Phys. Soc. Japan, 31(6),* (1971),p. 1846.

Shenai, K..,"A 55–V, 0.2–microohm–cm2 Vertical Trench Power MOSFET", *IEEE Electron Device Letters, 12,* (Mar., 1991),108–110.

Shenai, K..,"Electron Mobilities in MOS Channels Formed Along Anisotropically Dry Etched <110> Silicon Trench Sidewalls", *Electronics Letters, 27,* (Apr. 25, 1991),715–717.

Theil, J..A. ,"Deep Trench Fabrication by Si (110) Orientation Dependent Etching", *Journal of Vacuum Science & Technology B: Microelectronics and Nanometer Structures,* Abstract, obtained from http://ojps.aip.org/>,(Sep., 1995),1 p.

Togo, M..,et al. ,"Multiple–Thickness Gate Oxide and Dual–Gate Technologies for High Performance Logic–Embedded DRAms", *IEDM Technical Digest,* (1998),pp. 347–350.

Vitkavage, S..C. ,et al. ,"An investigation of Si–SiO2 interface charges in thermally oxidized (100), (110), (111), and (511) silicon",*J. Appl. Phys., 68(10),* (1990),pp. 5262–5272.

* cited by examiner

MULTIPLE OXIDE THICKNESSES FOR MERGED MEMORY AND LOGIC APPLICATIONS

RELATED APPLICATIONS

This application is a Divisional of U.S. application Ser. No. 09/386,185, filed Aug. 31, 1999 now U.S. Pat. No. 6,383,871 which is incorporated herein.

FIELD OF THE INVENTION

The present invention relates generally to integrated circuits. In particular, the present invention relates to a method and structure for oxide thicknesses on Metal Oxide Semiconductor Field Effect Transistor (MOSFET) technology for merged memory and logic applications.

BACKGROUND OF THE INVENTION

Typically, memory, e.g., Dynamic Random Access Memory (DRAM), and logic technologies have evolved along separate but parallel paths. In memory technology, for any particular lithography and power supply voltage level generation, the gate oxide thickness is limited by thin oxide reliability due to the stress of voltage boosted word lines. In contrast, for logic technology, thinner gate oxide thicknesses are generally the standard because of the need for high transconductance at lower internal operating voltages. Therefore, efforts to merge the technologies of memory and logic onto a single chip to create a "system on a chip" or other high function memory thus create a dilemma. That is, one is faced with the design choice of either (1) compromising the gate oxide thickness for one and/or both types of devices or (2) assuming the litany of complexities and expenses associated with the growing of two separate types of gate oxides on a single chip.

One current approach has been proposed that does provide a method of fabrication which allows for the scalable gate oxide thicknesses by either implanting $Ar^+$ or $N^+$ into a substrate prior to oxidation or implanting $O^+$ into the substrate after gate deposition. While this approach does facilitate gate oxide scalability when compared to conventional process integration, this technique does not provide a total solution since additional steps as well as expensive process tools are required. Accordingly, more advanced methods are still needed for providing multiple gate oxide thicknesses on a single chip. Desirably these more advanced methods will use existing MOSFET and DRAM processing techniques, thus avoiding any additional complexity in the wafer fabrication process. For these and other reasons there is a need for the present invention.

SUMMARY OF THE INVENTION

The above-mentioned problems with memory and logic technologies and other problems are addressed by the present invention and will be understood by reading and studying the following specification. Structures and methods are described which accord improved benefits for merged memory and logic applications.

Improved methods and structures are provided for multiple oxide thickness on a single silicon wafer. In particular, improved methods and structures are provided for multiple gate oxide thickness on a single chip which includes circuitry encompassing a range of technologies. For example, this range of technologies can include but is not limited to the memory and logic technologies. Moreover, these improved methods and structures for multiple oxide thickness on a single silicon wafer can be used in conjunction with existing fabrication and processing techniques with minimal or no added complexity.

Embodiments of a method for forming a semiconductor device include forming a top layer of $SiO_2$ (silicon dioxide) on a top surface of a silicon wafer. A trench layer of $SiO_2$ is also formed on a trench wall of the silicon wafer. The trench wall of the silicon wafer has a different order crystal plane-orientation than the top surface. Additionally, the formation of the top and trench layers of $SiO_2$ are such that a thickness of the top layer is different from a thickness of the trench layer.

One method of the present invention provides for forming a semiconductor device. Another method includes forming a DRAM that can include a trench capacitor or a stacked capacitor. Moreover, other embodiments provide for forming a Non-Volatile Random Access Memory (NVRAM) device, a flash memory device as well as a programmable logic array. The present invention also includes systems incorporating these different devices and circuits all formed according to the methods provided in this application.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
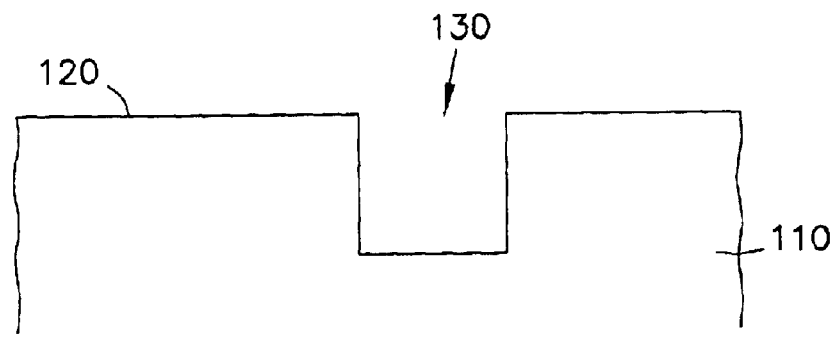
FIGS. 1A–1C illustrate an embodiment of a process of fabrication of oxide layers on a silicon wafer.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. Moreover, the term forming is understood to include growing through thermal oxidation, as is known in the art. The following detailed description is, therefore, not to be taken in a limiting sense, and the scope of the present invention is defined only by the appended claims, along with the full scope of equivalents to which such claims are entitled.

In particular, an illustrative embodiment of the present invention includes a method for forming a semiconductor device. The method includes forming a top layer of $SiO_2$ on a top surface of a silicon wafer. A trench layer of $SiO_2$ is also formed on a trench wall of the silicon wafer. Additionally, the trench wall of the silicon wafer has a different order plane-orientation than the top surface. The formation of the top and trench layer of $SiO_2$ is such that a thickness of the top layer is different from a thickness of the trench layer.

Another embodiment of the present invention includes a method for forming a semiconductor device. This method includes forming a top surface of a silicon wafer with a top crystalline plane orientation. A trench is also formed in the silicon wafer such that a trench wall has a different crystalline plane orientation than the top crystalline plane orientation of the top surface. Moreover, a top oxide layer is thermally grown on the top surface while a trench oxide layer is simultaneously thermally grown on the trench wall during a linear growth period. These two oxide layers are formed such that the top oxide layer has a different thickness than the trench oxide layer.

An alternate method embodiment of the present invention includes forming a DRAM. The method includes forming a top layer of $SiO_2$ on a top surface of a silicon wafer in which the top surface has a (100) crystal plane and a top thickness. Additionally, a trench layer of $SiO_2$ is formed on a trench wall of the silicon wafer. This trench wall has a (110) crystal plane. Moreover, the trench layer has a trench thickness that is different from the top thickness of the top surface of the silicon wafer.

Another method embodiment of the present invention includes forming a semiconductor device. The method includes forming a trench in a silicon wafer. In particular, the silicon wafer has a top surface that has a (100) crystal plane. Moreover, the trench has a trench wall that has a (110) crystal plane. The method also includes simultaneously thermally oxidizing the top surface to a top thickness while oxidizing the trench wall to a trench thickness that is different from the top thickness.

An additional method embodiment of the present invention includes forming a DRAM. This method includes forming a top device on a top surface of a silicon wafer. In particular the top surface has a (100) crystal plane and the top device includes a top gate separated from the (100) crystal plane by a top gate oxide. Moreover, the method includes the formation of a second device on a trench surface in the silicon wafer with the trench surface having a (110) crystal plane. The second device includes a second gate separated from the (110) crystal plane by a second gate oxide. Additionally, formation of the devices is such that a thickness of the top gate oxide is different from a thickness of the second gate oxide.

Another embodiment of the present invention includes a method for forming a stacked capacitor DRAM cell. This method includes forming a top device on a top surface of a silicon wafer. In particular, the top surface has a (100) crystal plane, and the top device includes a top gate separated from the (100) crystal plane by a top gate oxide. The method also includes the formation of a trench in the silicon wafer such that a trench wall of the trench has a (110) crystal plane. A second device is also formed on the trench wall of the trench in which the second device includes a second gate separated from the (110) crystal plane by a second gate oxide. Moreover, the formation of these devices is such that the top gate oxide has a thickness which is different from a thickness of the second gate oxide.

Another method embodiment of the present invention includes forming a Non-Volatile Random Access Memory (NVRAM) device. This method includes forming a top layer of $SiO_2$ on a top surface of a silicon wafer. The top surface has a (111) crystal plane orientation, and the top layer has a top thickness. Additionally, a trench layer of $SiO_2$ is formed on a trench wall of the silicon wafer. The trench wall has a (110) crystal plane orientation. Furthermore, the formation of the layers is such that the trench layer has a trench thickness that is different from the top thickness of the top layer.

An alternate method embodiment of the present invention includes forming a flash memory device. The method includes forming a top surface of a silicon wafer with a (111) crystalline plane orientation. A trench in the silicon wafer is also formed in which a trench wall has a (110) crystalline plane orientation. Additionally, a formation of a top oxide layer on the top surface occurs simultaneously with the formation of a trench oxide layer on the trench wall during a linear growth period. Moreover, the formation of the layers is such that the top oxide layer has a different thickness than the trench oxide layer.

A method embodiment of the present invention includes forming a CMOS logic circuit. The method includes forming a top layer of $SiO_2$ on a top surface of a silicon wafer. The top surface has a (111) crystalline orientation, and the top layer has a top thickness. Additionally, a trench layer of $SiO_2$ is formed on a trench wall of the silicon wafer. The trench wall has a (110) crystalline orientation and the trench layer has a trench thickness that is different from the top thickness of the top layer.

Another method embodiment of the present invention includes forming a semiconductor device. In particular, this method includes forming a top layer of $SiO_2$ on a top surface of a silicon wafer. The top surface has a (110) crystalline plane orientation, and the top layer has a top thickness. Moreover, a trench layer of $SiO_2$ is formed on a trench wall of the silicon wafer. The trench wall has a (311) surface, and the trench layer has a trench thickness that is different from the top thickness of the top layer. Additionally, the formation of the layers of $SiO_2$ is such that the layers are formed simultaneously during a linear growth period.

An alternate method embodiment of the present invention includes forming a semiconductor device. The method includes forming a top surface of a silicon wafer in which the top surface has a (110) crystalline plane orientation. Additionally, a trench is formed in the silicon wafer, such that a trench wall has a (511) crystalline plane orientation. The method also includes the thermally growth simultaneously of a top oxide layer on the top surface and a trench oxide layer on the trench wall, during a linear growth period, wherein the top oxide layer has a different thickness than the trench oxide layer.

Another method embodiment of the present invention includes forming a programmable logic array. The method includes forming a logic device on a top surface of a silicon wafer in which the top surface has a (100) crystal plane. The logic device includes a logic gate separated from the top surface by a logic gate oxide. The method also includes forming an Electronically Erasable Programmable Read Only Memory (EEPROM) device on a trench wall of the silicon wafer. The trench wall has a different order plane-orientation than the top surface, and the EEPROM device includes an EEPROM gate separated from the trench wall by an EEPROM gate oxide. In one embodiment, the EEPROM gate includes a floating gate for the EEPROM device. Additionally, the logic gate oxide has a thickness which is different from a thickness of the EEPROM gate oxide.

An apparatus embodiment of the present invention includes a semiconductor device. The semiconductor device includes a top device formed on a top surface of a silicon wafer. The top surface has a (110) crystal plane, and the top device has a top gate separated from the (110) crystal plane by a top gate oxide. Moreover, the semiconductor device includes a trench device formed on a trench wall of the silicon wafer. In particular, the trench wall has a (100) crystal plane, and the trench device has a trench gate separated from the trench wall by a trench gate oxide in which a thickness of the top gate oxide is different from a thickness of the trench gate oxide.

Another apparatus embodiment of the present invention includes a DRAM. The DRAM includes a top oxide layer formed on a top surface of a silicon wafer. The top surface has a (110) crystalline orientation, and the top oxide layer has a top oxide thickness. Moreover, the DRAM includes a trench oxide layer formed on a trench wall of the silicon wafer in which the trench wall has a (100) crystalline orientation. Additionally, the trench oxide layer has a trench oxide thickness that is different from the top oxide thickness.

An alternative apparatus embodiment of the present invention includes a semiconductor device. The semiconductor device includes a top surface of a silicon wafer. The top surface has a (110) surface. Moreover, the semiconductor device includes a trench wall in the silicon wafer in which the trench wall has a (511) surface. The semiconductor also includes a top oxide layer on the top surface as well as a trench oxide layer on the trench wall. In particular, the top oxide layer and the trench oxide layer are thermally grown simultaneously during a linear growth period, wherein the top oxide layer has a different thickness than the trench oxide layer.

Another apparatus embodiment of the present invention includes a flash memory device. The flash memory device includes a logic device formed on a top surface of a silicon wafer. The top surface has a (111) crystal plane orientation, and the logic device has a logic gate separated from the top surface by a logic gate oxide. The flash memory device also includes a flash memory cell formed on a trench wall of the silicon wafer, wherein the trench wall has a (110) crystal plane orientation. In particular, the flash memory cell has a flash gate separated from the trench wall by a flash gate oxide, wherein a thickness of the logic gate oxide is different from a thickness of the flash gate oxide.

An alternative apparatus embodiment of the present invention includes a semiconductor device. The semiconductor device includes a top layer of $SiO_2$ on a top surface of a silicon wafer. Additionally, the semiconductor device includes a trench layer of $SiO_2$ on a trench wall of the silicon wafer. In particular, the trench wall has a different order plane-orientation than the top surface, and the top layer has a different thickness than the trench layer.

An additional apparatus embodiment of the present invention includes a programmable logic array. The programmable logic array includes a logic device formed on a top surface of a silicon wafer in which the top surface has a (110) crystal plane orientation. Additionally, the logic device has a logic gate separated from the top surface by a logic gate oxide. The programmable logic array also includes an Electronically Erasable Programmable Read Only Memory (EEPROM) device formed on a trench wall of the silicon wafer. The EEPROM device has an EEPROM gate separated from the trench wall by an EEPROM gate oxide. Moreover, the trench wall has a different order plane-orientation than top surface, and a thickness of the logic gate oxide is different from a thickness of the EEPROM gate oxide.

Another apparatus embodiment of the present invention includes an electronic system. The electronic system includes a processor as well as an integrated circuit coupled to the processor. The integrated circuit includes a top device formed on a top surface of a silicon wafer in which the top surface has a (110) crystal plane orientation, and the top device has a top gate separated from the top surface by a top gate oxide. The integrated circuit of the electronic system also includes a trench device formed on a trench wall of the silicon wafer. The trench wall has a (100) crystal plane orientation, and the trench device has a trench gate separated from the trench wall by a trench gate oxide. Moreover, a thickness of the top gate oxide is different from a thickness of the trench gate oxide, and the top gate oxide and the trench gate oxide are thermally grown simultaneously during a linear growth period.

An alternative apparatus embodiment of the present invention includes an electronic system. The electronic system includes a processor as well as a flash memory device. The flash memory device includes a logic device formed on a top surface of a silicon wafer. The top surface has a (111) crystal plane orientation, and the logic device has a logic gate separated from the top surface by a logic gate oxide. The flash memory device of the electronic system also includes a flash memory cell formed on a trench wall of the silicon wafer in which the trench wall has a (110) crystal plane orientation. The flash memory cell has a flash gate separated from the trench wall by a flash gate oxide. In one embodiment, the flash gate includes a floating gate for the flash memory cell. Additionally, a thickness of the flash gate oxide is different from the logic gate oxide.

Another apparatus embodiment of the present invention includes an electronic system. The electronic system includes a processor as well as a decode circuit. The decode circuit includes a logic circuit formed on a top surface of a silicon wafer in which the top layer has a (110) crystal plane orientation. Additionally, the logic circuit has a logic gate separated from the top layer by a logic gate oxide. The decode circuit of the electronic system includes an EEPROM device formed on a trench wall of the silicon wafer. The EEPROM device has an EEPROM gate separated from the trench wall by an EEPROM gate oxide in which the trench wall has a different order plane-orientation than top surface. Moreover, a thickness of the EEPROM gate oxide is different from a thickness of the logic gate oxide.

Figure 1B:
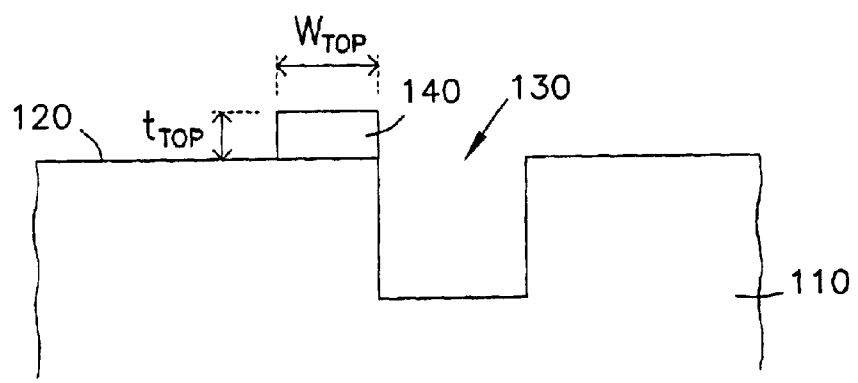
Figure 1C:
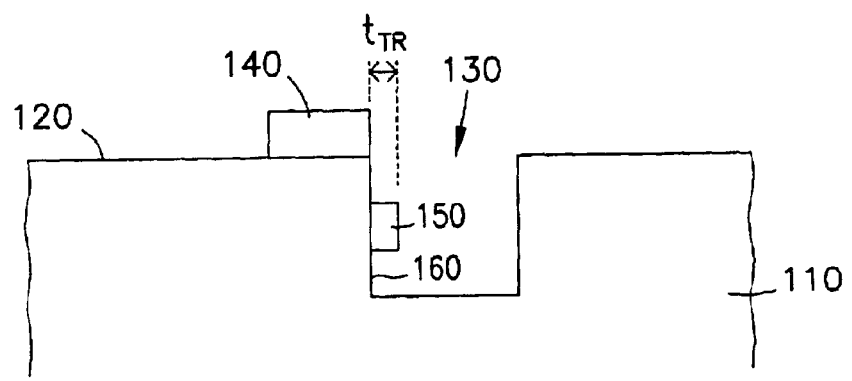

FIGS. 1A–1C illustrate an embodiment of a process of fabrication of oxide layers on a silicon wafer according to teachings of the present invention. The sequence can be followed as a method for forming a semiconductor device, as a method for forming a DRAM that can include a trench capacitor or a stacked capacitor, as a method for forming a Non-Volatile Random Access Memory (NVRAM), e.g., a flash memory device, as a method for forming a CMOS logic circuit as well as a method for forming a programmable logic array.

FIG. 1A shows the structure subsequent to the formation of a trench 130 in a silicon wafer 110, the processing of which is well known in the art. The silicon wafer 110 has a top surface 120. In one embodiment, the top surface 120 of a silicon wafer 110 is formed with a specific top crystalline plane orientation. In one embodiment, the top surface 120 has a (100) crystalline plane orientation. In another embodiment, the top surface 120 has a (110) crystalline plane orientation. In an additional embodiment, the top surface 120 has a (111) crystalline plane orientation. Other specific top crystalline plane orientations are similarly included which are suited to carry out the embodiments of the present invention. One of ordinary skill in the art will appreciate upon reading this disclosure the top crystalline plane orientations suited to carry out the novel embodiments of the present invention.

FIG. 1B illustrates the structure following the next sequence of processing. A top layer of $SiO_2$ (silicon dioxide) 140 is formed on the top surface 120 of the silicon wafer 110. One of ordinary skill in the art will appreciate the masking and etching techniques by which an isolated top layer of $SiO_2$ 140 can be defined as shown in FIG. 1B. In one embodiment, a thickness ($t_{TOP}$) of the top layer of $SiO_2$ 140 is approximately 70 Angstroms. In this embodiment, a width ($w_{TOP}$) is defined suitable for serving as a gate oxide layer. In one embodiment, the top layer of $SiO_2$ 140 is defined with a $t_{TOP}$ and a $w_{TOP}$ suitable for use as a gate oxide in logic device applications.

In one embodiment, the top layer of $SiO_2$ 140 is formed on the top surface 120 through dry oxidization at a temperature of approximately 800° C. In an alternative embodiment, the top layer of $SiO_2$ 140 is formed on the top surface 120 through wet oxidization at a temperature of approximately 800° C. One of ordinary skill in the art will understand other method embodiments suitable to form the top layer of $SiO_2$ 140 according to the teachings of the present invention.

FIG. 1C illustrates the structure following the next sequence of processing. A trench layer of $SiO_2$ 150 is formed on a trench wall 160 of the silicon wafer 110. According to the teachings of the present invention, the trench wall 160 is formed having a specific crystalline plane orientation different from that of the top surface 120. In one embodiment, the trench wall 160 has a different plane orientation than the top surface 120. For example, when the top surface 120 is formed having a (100) surface, the trench wall 160 is formed having a (110) surface. Other specific crystalline plane orientations of the trench wall are similarly included which are suited to carry out the embodiments of the present invention. One of ordinary skill in the art will appreciate upon reading this disclosure the crystalline plane orientations of the trench wall suited to carry out the novel embodiments of the present invention. Moreover, the crystalline plane orientations of the trench wall 160 are controlled to have a specific orientation in relationship to the crystalline plane orientations of the top surface 120 to achieve the embodiments of the present invention. Upon reading this disclosure, one of ordinary skill in the art will appreciate the manner in which the top surface and the trench wall can be formed to possess this described specific relationship.

According to the teachings of the present invention, the trench layer of $SiO_2$ 150 is formed in a same linear growth period with the top layer of $SiO_2$ 140. Based upon the specific crystalline plane orientations chosen for the top surface 120 and the trench wall 160, the top layer of $SiO_2$ 140 will have a resultant or end thickness which is different from the trench layer of $SiO_2$ 150 formed in a same amount of time. Thus, according to the teachings of the present invention, the thickness ($t_{TOP}$) of the top layer of $SiO_2$ 140 is different from a thickness ($t_{TR}$) of the trench layer of $SiO_2$ 150. As explained above in connection with FIG. 1B, the trench layer of $SiO_2$ 150 can be masked and etched to form a defined trench layer of $SiO_2$ 150. In one embodiment, the trench layer of $SiO_2$ 150 is masked and etched to form or define a gate oxide for a DRAM cell. In another embodiment, the formation of the top layer of $SiO_2$ 140 and the trench layer of $SiO_2$ 150 is such that the two layers are formed simultaneously during a linear growth period.

In one embodiment, the formation of the top layer of $SiO_2$ 140 and the trench layer of $SiO_2$ 150 is such that the thickness ($t_{TR}$) of the trench layer of $SiO_2$ 150 is greater than the thickness ($t_{TOP}$) of the top layer of $SiO_2$ 140. For example, according to the teachings of the present invention, when the top surface 120 is formed with a (100) crystalline plane orientation and the trench wall 160 is formed with a (110) crystalline plane orientation, $t_{TR} > t_{TOP}$. In an alternative embodiment, the formation of the top layer of $SiO_2$ 140 and the trench layer of $SiO_2$ 150 is such that the thickness ($t_{TR}$) of the trench layer of $SiO_2$ 150 is less than the thickness ($t_{TOP}$) of the top layer of $SiO_2$ 140; all dependent on the chosen crystalline plane orientation for the top surface 120 and the trench wall 160. In another embodiment, the formation of the top layer of $SiO_2$ 140 and the trench layer of $SiO_2$ 150 is such that the thickness ($t_{TR}$) of the trench layer of $SiO_2$ 150 is approximately 30% thicker than the thickness ($t_{TOP}$) of the top layer of $SiO_2$ 140. In another embodiment, the thickness ($t_{TR}$) of the trench layer of $SiO_2$ 150 is approximately 100 Angstroms. In one embodiment, the trench layer of $SiO_2$ 150 is a gate oxide of a DRAM cell, which is adapted for use with a DRAM cell having an operating voltage of less than 3.5 volts.

In one embodiment of formation, the trench layer of $SiO_2$ 150 is formed on the trench wall 160 through dry oxidization at a temperature of approximately 800° C. In an alternative embodiment, the trench layer of $SiO_2$ 150 is formed on the trench wall 160 through wet oxidization at a temperature of approximately 800° C. One of ordinary skill in the art will understand other method embodiments suitable to form the trench layer of $SiO_2$ 150 according to the teachings of the present invention.

Figure 2:
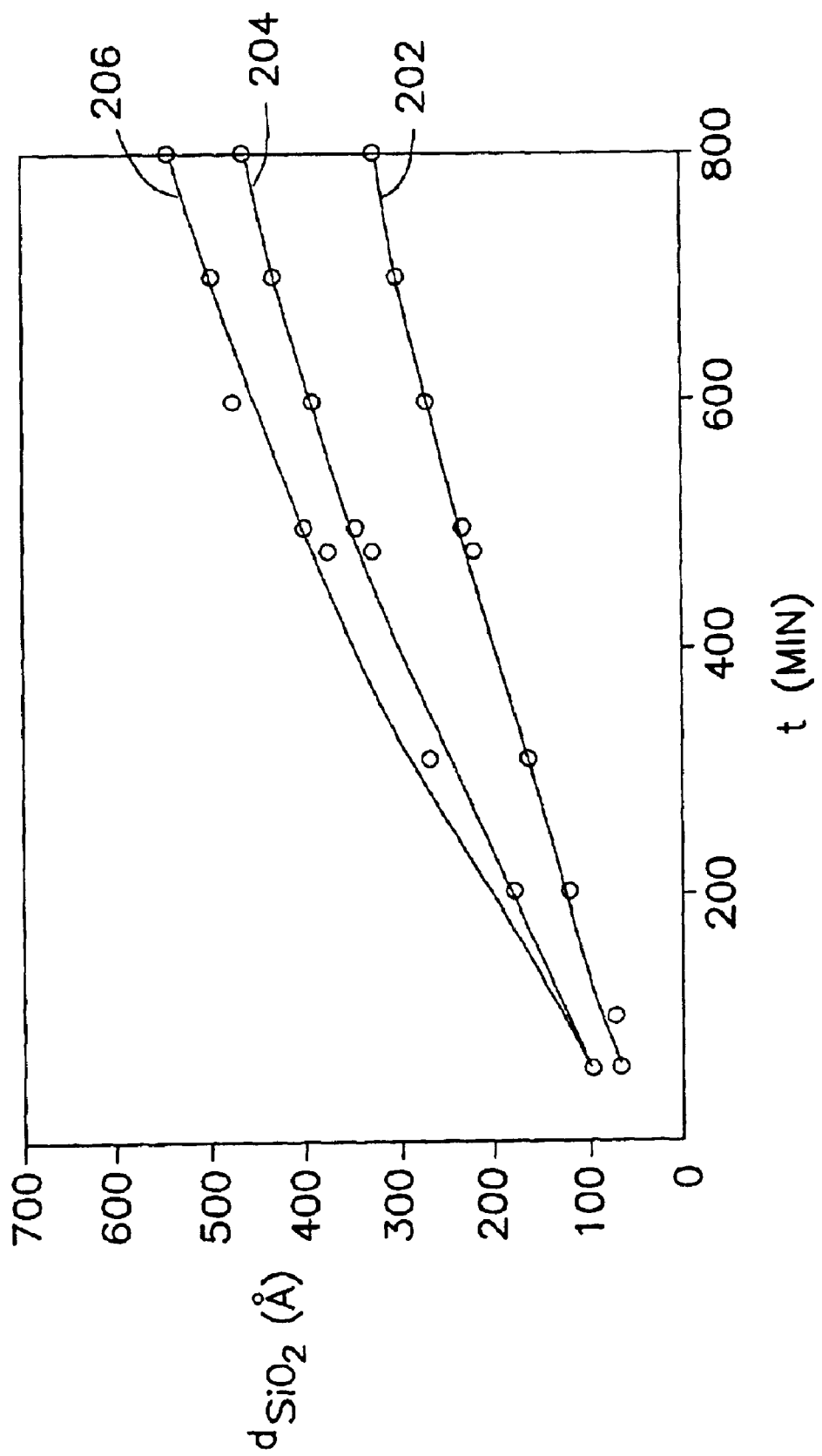
FIG. 2 is a graph that illustrates an oxide thickness vs. time of oxidation for different silicon crystalline plane orientations.

As illustrated in FIG. 2, forming two specific interrelated crystalline plane orientations in a manner according to the teachings of the present invention facilitates or allows for the realization of different, but specifically designed, oxidation rates upon two different surfaces of the same silicon structure. The graph of FIG. 2 plots the oxide thickness ($d_{SiO2}$), expressed in Angstroms, on a silicon substrate versus the allowed time of oxidation (t), shown in minutes. In the graph of FIG. 2, the oxide layers are thermally grown at 800° C. upon a silicon surface having three distinct crystalline plane orientations (i.e., (111), (110) and (100)). FIG. 2 includes plot 202, plot 204 and plot 206. Plot 202 is the graphical plot of oxide thickness vs. time of oxidation to grow an oxide layer on a silicon surface having a (100) crystalline plane orientation. Plot 204 is the graphical plot of oxide thickness vs. time of oxidation to grow an oxide layer on a silicon surface having a (110) crystalline plane orientation. Plot 206 is the graphical plot of oxide thickness vs. time of oxidation to grow an oxide layer on a silicon structure having a (111) crystalline plane orientation. Thus, controlling the specific crystalline plane orientation of different surfaces of the silicon structure advantageously yields different oxidation rates at designed or predicted locations. These different oxidation rates at designed locations over a particular time period, thus, allow for the structuring of gate oxides of differing thickness to accommodate differing technologies (e.g., DRAM and logic technologies) on a single chip or single silicon structure. Hence, designed locations can facilitate the formation of different device structures in a single streamlined process flow.

Figure 3A:
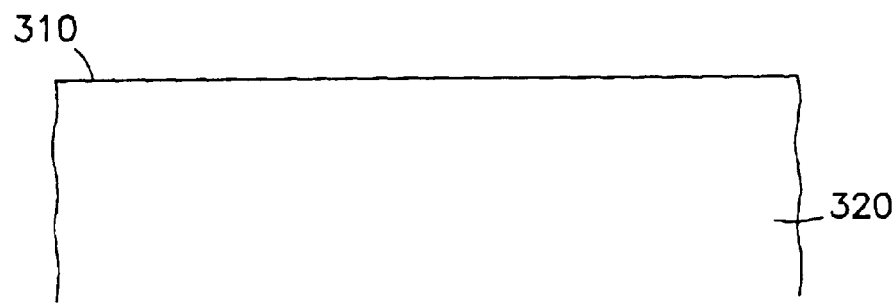
FIGS. 3A–3C illustrate another embodiment of a process of fabrication of oxide layers on a silicon wafer.
Figure 3B:
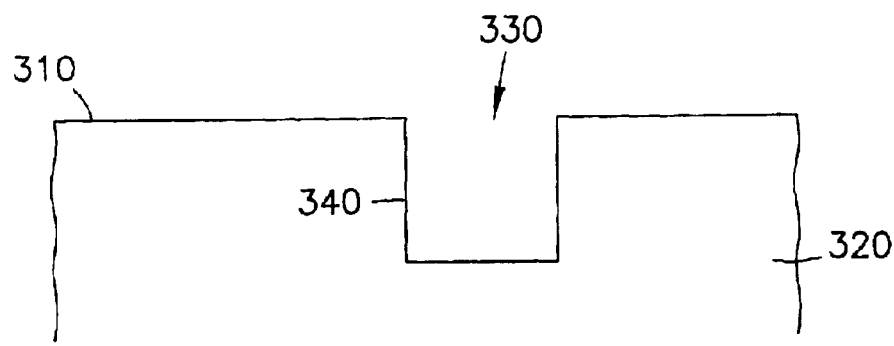
Figure 3C:
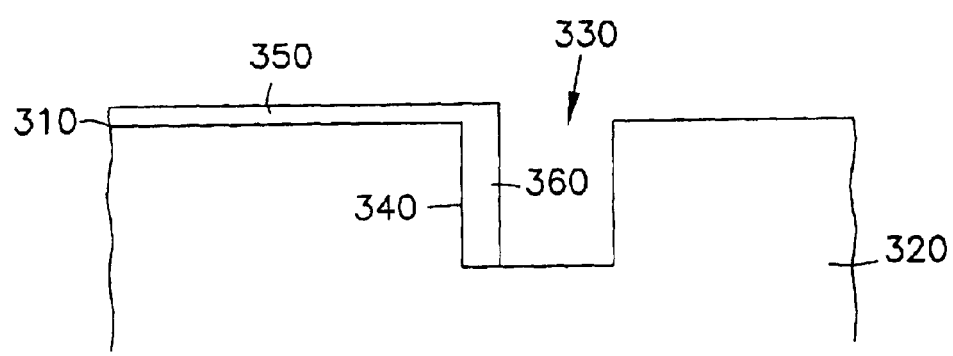

FIGS. 3A–3C illustrate another embodiment of a process of fabrication of oxide layers on a silicon wafer according to teachings of the present invention. The sequence can be followed as a portion of a method for forming a semiconductor device, a DRAM that can include a trench capacitor or a stacked capacitor, a Non-Volatile Random Access Memory (NVRAM), (e.g., a flash memory device), a CMOS logic circuit as well as a programmable logic array.

FIG. 3A shows the structure after the first sequence of processing. A top surface 310 of a silicon wafer 320 is formed with a top crystalline plane orientation. In one embodiment, the top surface 310 has a (100) crystalline plane orientation. In another embodiment, the top surface 310 has a (110) crystalline plane orientation. In an additional embodiment, the top surface 310 has a (111) crystalline plane orientation. In all of these embodiments, the top crystalline plane orientation is designed to achieve the embodiments of the present invention.

FIG. 3B shows the structure after the next sequence of processing. A trench 330 is formed in the silicon wafer 320 such that a trench wall 340 has a different order plane orientation than the top crystalline plane orientation of the top surface 310. In one embodiment, the trench wall 340 has a (110) crystalline plane orientation. In another embodiment, the trench wall 340 has a (311) crystalline plane orientation. In an additional embodiment, the trench wall 340 has a (511) crystalline plane orientation However, it is important to appreciate that the crystalline plane orientation of the trench wall 340 is decisively designed in relationship to the crystalline plane orientation of the top surface 310 to achieve the embodiment of the present invention.

FIG. 3C shows the structure after the next sequence of processing. Simultaneously, a top oxide layer 350 is formed on the top surface 310, and a trench oxide layer 360 is formed on the trench wall 340 during a linear growth period, such that the top oxide layer 350 has a thickness ($t_{TOP}$) that is different from a thickness ($t_{TR}$) of the trench oxide layer 360. In one embodiment, the top oxide layer 350 and the trench oxide layer 360 are grown on the respective surfaces by thermal oxidation. In one embodiment, the top oxide layer 350 will subsequently be formed into a gate oxide of a logic device. In this embodiment, the top oxide layer 350 has a thickness which is selected for a logic device having an operating voltage of less than 2.5 volts.

In one embodiment, the crystalline plane orientations of the top surface 310 and the trench wall 340 are such that the thickness ($t_{TR}$) of the trench oxide layer 360 is greater than the thickness ($t_{TOP}$) of the top oxide layer 350 when formed in a linear time period. In another embodiment, the crystalline plane orientation of the top surface 310 and the trench wall 340 are such that the thickness ($t_{TR}$) of the trench oxide layer 360 is approximately 30% greater than the thickness ($t_{TOP}$) of the top oxide layer 350 when formed in a linear time period. In one embodiment, the thickness ($t_{TOP}$) of the top oxide layer 350 is approximately 70 Angstroms. In one embodiment, the thickness ($t_{TR}$) of the trench oxide layer 360 is approximately 100 Angstroms.

In one embodiment, the crystalline plane orientation of the trench wall 340 is such that when the trench oxide layer 360 is formed in the linear time period the resulting oxide thickness is suitable for forming a gate oxide of a DRAM cell. In one embodiment, the trench oxide layer 360 is suitably formed to serve as a gate oxide of a DRAM cell having an operating voltage of less than 3.5 volts.

In one embodiment of formation, the top oxide layer 350 and the trench oxide layer 360 are grown on the top surface 310 and the trench wall 340, respectively, through dry oxidization at a temperature of approximately 800° C. In an alternative embodiment, the top oxide layer 350 and the trench oxide layer 360 are grown on the top surface 310 and the trench wall 340, respectively, through wet oxidization at a temperature of approximately 800° C. One of ordinary skill in the art will understand other method embodiments suitable to form the top oxide layer 350 and the trench oxide layer 360 according to the teachings of the present invention.

Figure 4A:
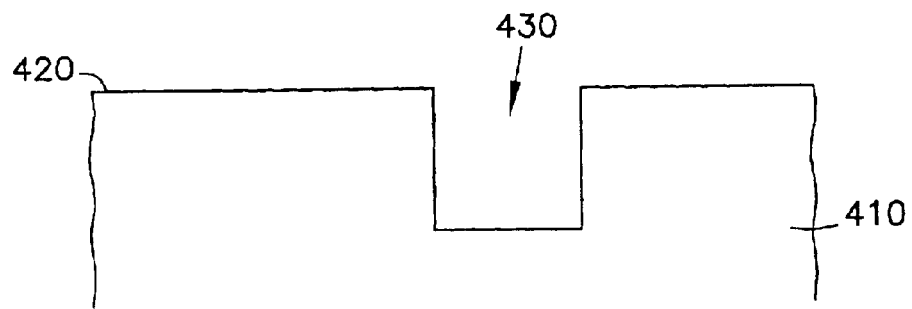
FIGS. 4A–4C illustrate an alternate embodiment of a process of fabrication of oxide layers on a silicon wafer.
Figure 4B:
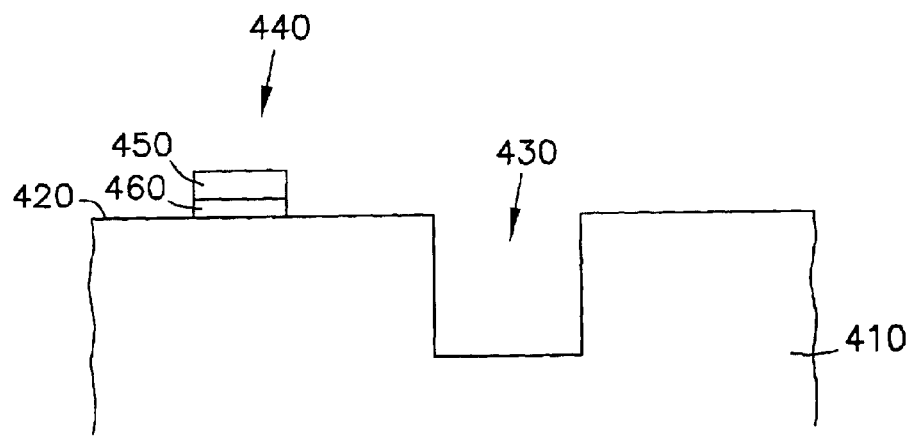
Figure 4C:
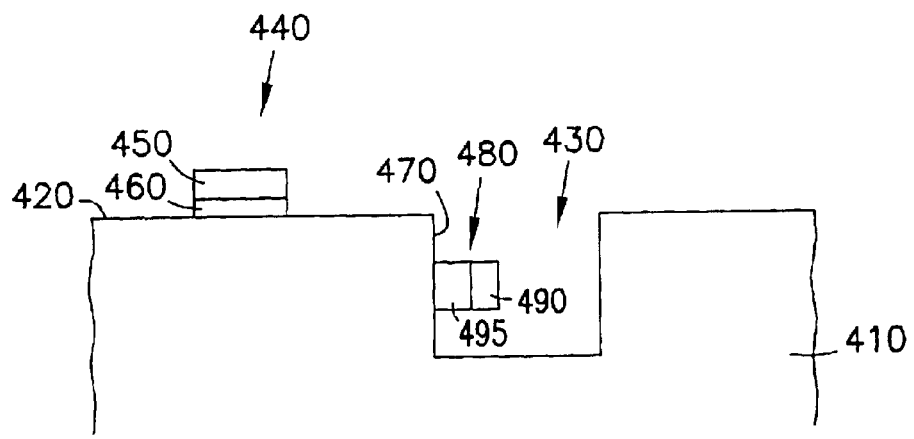

FIGS. 4A–4C illustrate an embodiment of a process of fabrication of layers of oxide on a silicon wafer according to teachings of the present invention. The sequence can be followed as a method for forming a semiconductor device, as a method for forming a DRAM, as a method for forming a Non-Volatile Random Access Memory (NVRAM), such as a flash memory device, or as a method for forming a CMOS logic circuit as well as a method for forming a programmable logic array.

FIG. 4A shows the structure subsequent to the formation of a trench 430 in a silicon wafer 410, the processing of which is well known in the art. The silicon wafer 410 has a top surface 420. According to the teachings of the present invention, the top surface 420 of the silicon wafer 410 is formed with a specific top crystalline plane orientation. In one embodiment, the top surface 420 has a (100) crystalline plane orientation. In another embodiment, the top surface 420 has a (110) crystalline plane orientation. In an additional embodiment, the top surface 420 has a (111) crystalline plane orientation. Other specific top crystalline plane orientation are similarly included which are suited to carry out the embodiments of the present invention. One of ordinary skill in the art will appreciate upon reading this disclosure the top crystalline plane orientations suited to carry out the novel embodiments of the present invention.

FIG. 4B illustrates the structure following the next sequence of processing. A top device 440 is formed on the top surface 420 of the silicon wafer 410. In one embodiment, the top device 440 is a logic device. In particular, the top device 440 includes forming a top gate oxide 460, according to the teachings of the present invention, over a linear time period on the top surface 420. In one embodiment, the top gate oxide 460 is grown on the top surface 420 by thermal oxidation, as is known in the art. Moreover, a top gate 450 is formed on the top gate oxide 460. One of ordinary skill in the art will understand upon reading this disclosure the manner in which masking and etching techniques can be employed to form such a logic device. In another embodiment, the top gate oxide 460 has a thickness ($t_{TOP}$) of approximately 70 Angstroms. In one embodiment, the top gate oxide 460 is formed to accommodate a top device having an operating voltage of less than 2.5 volts.

FIG. 4C illustrates the structure following the next sequence of processing. According to one embodiment of the present invention, the trench wall 470 has a different plane orientation than the top surface 420 in FIG. 4B. In one embodiment, the trench wall 470 has a (110) crystalline plane orientation. In another embodiment, the trench wall 470 has a (311) crystalline plane orientation. In an additional embodiment, the trench wall 470 has a (511) crystalline plane orientation. However, it is important to appreciate that the crystalline plane is chosen to be specifically interrelated to the chosen specific crystalline plane orientation of the top surface in order to achieve specific and different gate oxide thicknesses according to teachings of the present invention.

A trench device 480 is formed on a trench wall 470 of a trench 430 in the silicon wafer 410. The trench device 480 includes forming a trench gate oxide 495, according to the teachings of the present invention, over a linear time period on the trench wall 470. In one embodiment, the trench gate oxide 495 is grown on the trench wall 470 by thermal oxidation, as is known in the art. Moreover, a trench gate 490 is formed on the trench gate oxide 495. One of ordinary skill in the art will understand upon reading this disclosure the manner in which masking and etching techniques can be employed to form such a trench device. In one embodiment, the thickness ($t_{TOP}$) of the top gate oxide 460 is different from a thickness ($t_{TR}$) of the trench gate oxide 495. In one embodiment, the trench device 480 is a DRAM cell. In another embodiment, the top gate oxide 460 and the trench gate oxide 495 are formed simultaneously during a linear growth period (i.e., the oxide is formed over the same length of time). In one embodiment, the thickness ($t_{TR}$) of the trench gate oxide 495 is thicker than the thickness ($t_{TOP}$) of the top gate oxide 460. For example, according to the teachings of the present invention, when the top surface 420 is formed with a crystalline plane orientation of (100) and the trench wall 470 is formed with a crystalline plane orientation of (110), $t_{TR} > t_{TOP}$. In one embodiment, the thickness ($t_{TR}$) of the trench gate oxide 495 is approximately 30% thicker than the thickness ($t_{TOP}$) of the top gate oxide 460. In one embodiment, the thickness ($t_{TR}$) of the trench gate oxide 495 is approximately 100 Angstroms. In one embodiment, the trench gate oxide 495 is formed to function in the trench device 480 operating with a voltage of less than 3.5 volts.

Figure 5:
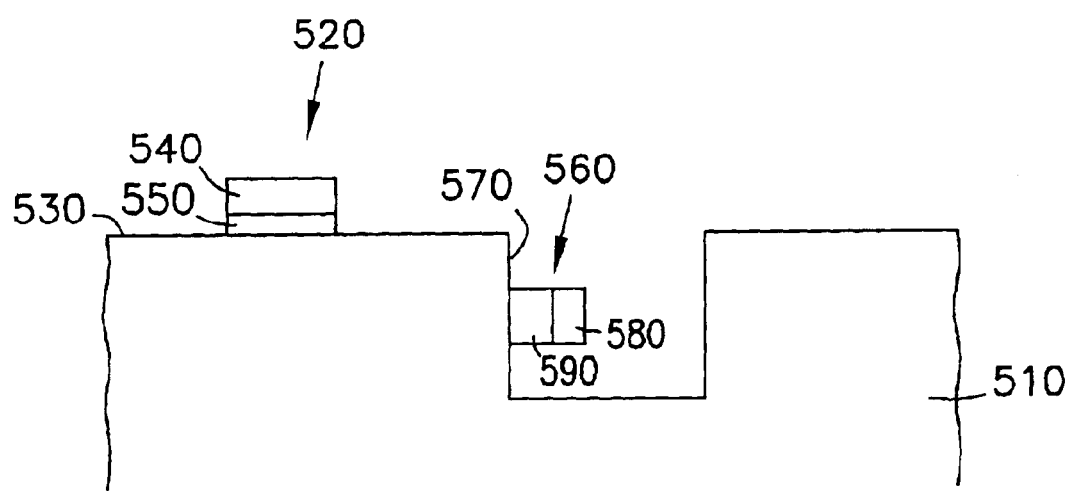
FIG. 5 is a cross-sectional view of an embodiment of oxide layers on a silicon wafer according to the teachings of the present invention.

FIG. 5 is a cross-sectional view of an embodiment of a semiconductor device according to the teachings of the present invention. The semiconductor device of FIG. 5 is constructed in a similar manner according to any one of the methods presented in this application. The semiconductor device includes a top device 520 on a top surface 530 of a silicon wafer 510. In one embodiment, the top surface 530 is formed with a (100) crystalline plane orientation. In another embodiment, the top surface 530 has a (110) crystalline plane orientation. In an additional embodiment, the top surface 530 has a (111) crystalline plane orientation. Other specific top crystalline plane orientation are similarly included which are suited to carry out the embodiments of the present invention. One of ordinary skill in the art will appreciate upon reading this disclosure the top crystalline plane orientations suited to carry out the novel embodiments of the present invention. Additionally, the top device 520 includes a top gate 540 that is separated from the top surface 530 by a top gate oxide 550. In one embodiment, the top gate oxide 550 is formed to function in a top device 520 operating with a voltage of less than 2.5 volts.

The semiconductor device of FIG. 5 also includes a trench device 560 formed on a trench wall 570 of the silicon wafer 510. In one embodiment, the trench wall 570 has a different plane orientation than the top surface 530. In one embodiment, the trench wall 570 has a (110) surface. In another embodiment, the trench wall 570 has a (311) surface. In an additional embodiment, the trench wall 570 has a (511) surface. Other specific crystalline plane orientations of the trench wall 570 are similarly included which are suited to carry out the embodiments of the present invention. One of ordinary skill in the art will appreciate upon reading this disclosure the crystalline plane orientations of the trench wall 570 suited to carry out the novel embodiments of the present invention. Moreover, the trench device 560 has a trench gate 580 separated from the trench wall 570 by a trench gate oxide 590 formed according to the teachings of the present invention.

According to the teachings of the present invention, a thickness ($t_{TOP}$) of the top gate oxide 550 is different from a thickness ($t_{TR}$) of the trench gate oxide 590. In one embodiment, the top gate oxide 550 and the trench gate oxide 590 are such that the thickness ($t_{TR}$) of the trench gate oxide 590 is thicker than the thickness ($t_{TOP}$) of the top gate oxide 550. In another embodiment, the thickness ($t_{TR}$) of the trench gate oxide 590 is approximately 30% thicker than the thickness ($t_{TOP}$) of the top gate oxide 550. In another embodiment, the thickness ($t_{TOP}$) of the top gate oxide 550 is approximately 70 Angstroms. In another embodiment, the thickness ($t_{TR}$) of the trench gate oxide 590 is approximately 100 Angstroms.

In one embodiment, the trench device 560 is a portion of a DRAM cell. In one embodiment, the trench gate oxide 590 is formed to function with a trench device 560 having an operating voltage of less than 3.5 volts. In another embodiment, the top gate oxide 550 and the trench gate oxide 590 are thermally grown simultaneously during a linear growth period (i.e., the oxide is formed over the same length of time).

In one embodiment, the trench device 560 is an EEPROM device. In this embodiment, the trench device 560 includes a flash memory device. In one embodiment, the top device 520 is a logic device. In one embodiment, the trench device 560 is included as part of a programmable logic array.

In one embodiment, the top surfaces and trench walls illustrated and described in conjunction with FIGS. 1–5 comprise a portion of the structure necessary for forming vertical transistors formed according to embodiments described in application Ser. No. 08/889,463 entitled "4F² Folded Bit Line DRAM Cell Structure having Buried Bit and Word Lines," filed on Jul. 8, 1997, which is hereby incorporated by reference. In particular, a vertical transistor used in conjunction with embodiments of the present invention is illustrated in FIG. 6.

Figure 6:
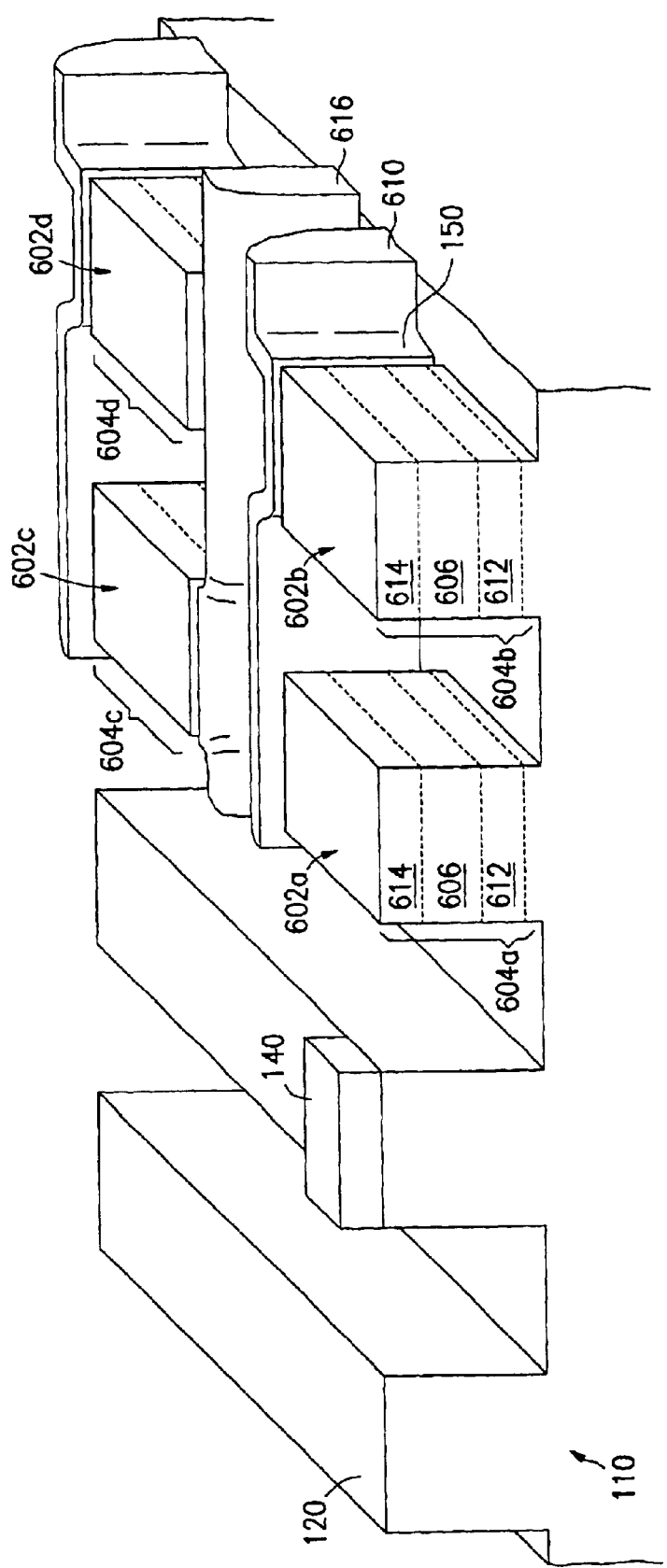
FIG. 6 is a perspective view illustrating generally one embodiment of a portion of vertical MOSFETs used in conjunction with embodiments of the present invention.

FIG. 6 is a perspective view illustrating generally one embodiment of a portion of an array of vertical transistors formed according to the embodiments of the present invention. Those of ordinary skill in the art will appreciate that FIG. 6 may include other components, including top surface devices (not shown). As shown in FIG. 6, portion of an array of vertical transistors formed according to the teachings of the present invention. The vertical transistors 602a–d shown in FIG. 6 include vertically oriented access FETs (Field Effect Transistors) 604a–d.

In the embodiment of FIG. 6, access FETs 604a–d include an n+ silicon layer formed on the silicon wafer 110 to produce first source/drain regions 612 of access FETs 604a–d. A p– silicon layer is formed on n+ first source/drain region 612 to form the body region 606 of access FETs 604a–d. A further n+ silicon layer is formed on p– body region 606 to produce second source/drain region 614 of access FETs 604a–d. The trench layer surface of each region, 612, 606 and 614, is formed with an identical crystalline plane orientation to achieve the embodiments of the present invention.

Conductive segments of a first word line 610 and a second word line 616 provide integrally formed gates for access FETs 604b and 604c. The trench layer of $SiO_2$ 150 includes the trench layer of $SiO_2$ described and explained above in connection with FIGS. 1–5. The trench layer of $SiO_2$ 150 is an oxide layer formed between the first word line 610 and/or the second word line 616 and the body regions 606 of access FETs 604b and 604c. FIG. 6 also includes the top layer of $SiO_2$ 140 which includes the top layer of $SiO_2$ described and explained in detail in connection with FIGS. 1–5.

Figure 7:
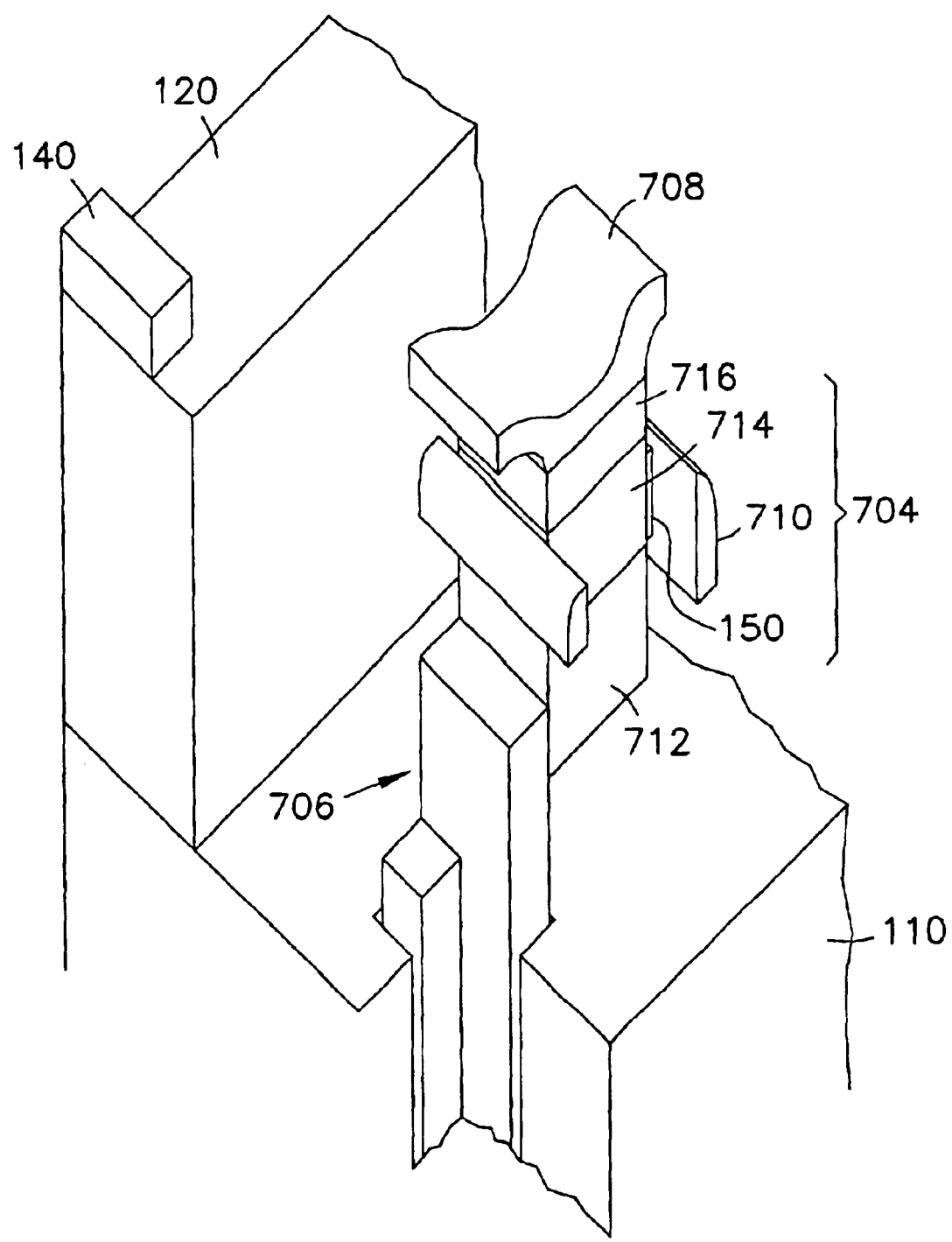
FIG. 7 is a perspective view illustrating generally another embodiment of a portion of memory used in conjunction with embodiments of the present invention.

FIG. 7 is an alternative embodiment of a vertical transistor used in conjunction with embodiments of the present invention. In one embodiment, portions of the trench devices illustrated and described in conjunction with FIGS. 1–5 are vertical transistors of a DRAM cell formed according to embodiments described in application Ser. No. 09/204,072, entitled "Trench DRAM Cell with Vertical Device and Buried Word Lines," filed on Dec. 3, 1998, which is hereby incorporated by reference.

FIG. 7 is a perspective view illustrating generally one embodiment of a vertical transistor formed in conjunction with embodiments of the present invention. Those of ordinary skill in the art will appreciate that FIG. 7 may include other components, including top surface devices (not shown). FIG. 7 illustrates a DRAM cell including a vertically oriented access FET 704 and a capacitor 706. The vertically oriented access FET 704 includes an n+ silicon layer formed on a silicon wafer 110 to produce a first source/drain region 712. A p– silicon layer is formed on the first source/drain region 712 to form a body region 714. Additionally, the vertically oriented access FET 704 includes an n+ silicon layer formed on the p– body region 714 to produce a second source/drain region 716. In one embodiment, the vertically oriented access FET 704 is formed in semiconductor pillars that extend outwardly from the silicon wafer 110.

Additionally, FIG. 7 includes conductive segments of a bit line 708, a portion of which is formed on the second source drain region 716. FIG. 7 also includes conductive segments of a word line 710 that provide integrally formed gates for the vertically oriented FET 704. The trench layer of $SiO_2$ 150 includes the trench layer of $SiO_2$ described and explained above in connection with FIGS. 1–5. The trench layer of $SiO_2$ 150 is an oxide layer formed between the word line 710 and the body region 714 of vertically oriented FET 704. FIG. 7 also includes the top layer of $SiO_2$ 140 which includes the top layer of $SiO_2$ described and explained in detail in connection with FIGS. 1–5.

Figure 8:
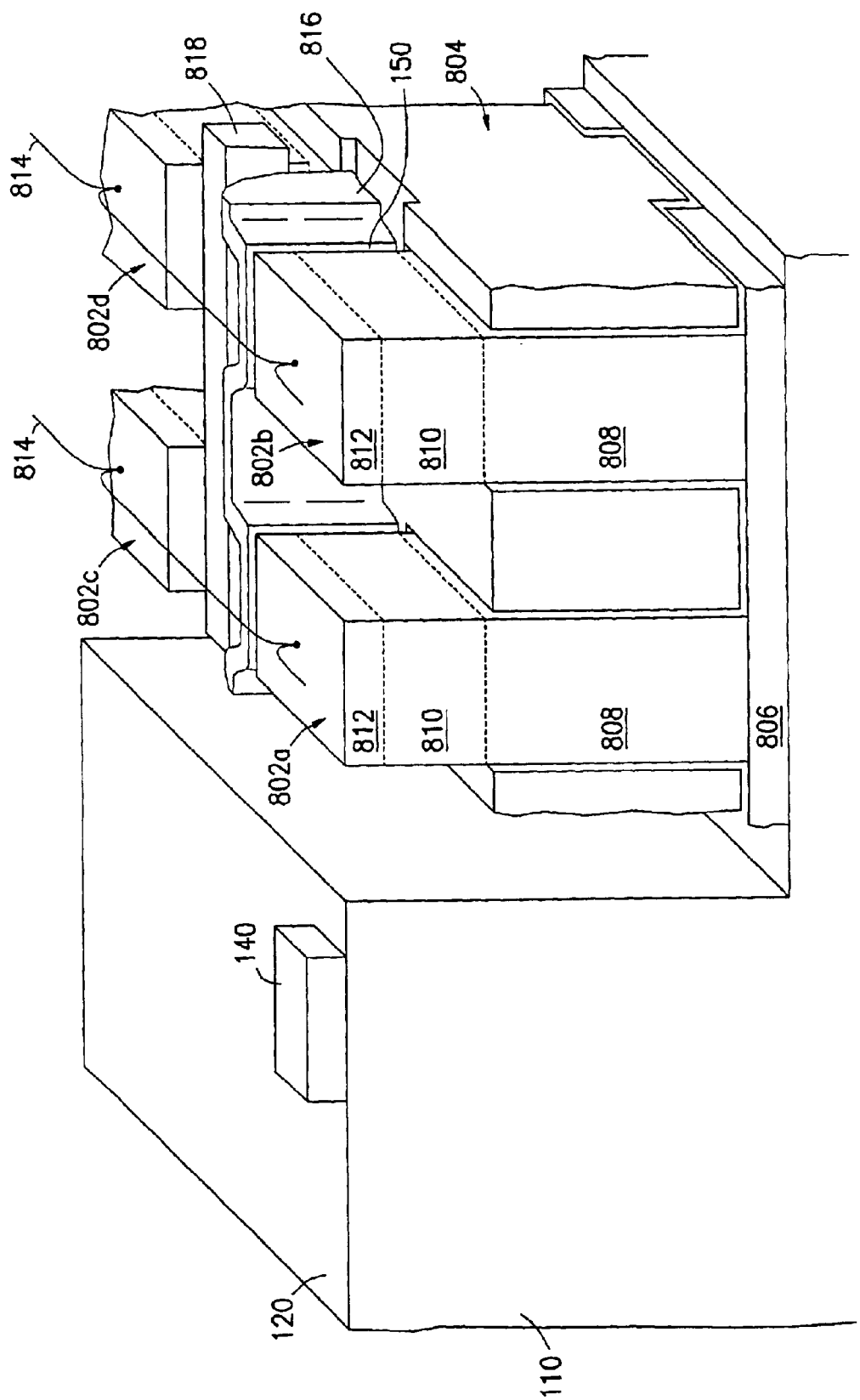
FIG. 8 is a perspective view illustrating generally an alternative embodiment of a portion of memory used in conjunction with embodiments of the present invention.

FIG. 8 is an alternative embodiment of vertical transistors used in conjunction with embodiments of the present invention. In one embodiment, portions of the trench devices illustrated and described in conjunction with FIGS. 1–5 are vertical transistors of a DRAM cell formed according to embodiments described in application Ser. No. 08/939,732, entitled "Circuit and Method for an Open Bit Line Memory Cell with a Vertical Transistor and Trench Plate Trench Capacitor," filed on Oct. 6, 1997, which is hereby incorporated by reference.

FIG. 8 is a perspective view illustrating generally one embodiment of a portion of a memory formed in conjunction with embodiments of the present invention. Those of ordinary skill in the art will appreciate that FIG. 8 may include other components, including top surface devices (not shown). FIG. 8 illustrates portions of four trench devices 802a–d and a storage capacitor plate 804 formed in conjunction with embodiments of the present invention.

The vertical transistors 802a–d include an n+ silicon layer formed on Silicon On Insulator (SOI) material 806 which has been formed on a silicon wafer 110 to produce a first source/drain region 808. A p– silicon layer is formed on the first source/drain region 808 to form a body region 810. Additionally, the trench devices 802a–d include an n+ silicon layer formed on the p– body region 810 to produce a second source/drain region 812.

Additionally, FIG. 8 includes conductive segments of bit line wires 814, a portion of which is formed on the second source drain region 812. FIG. 8 includes a body contact line 818. Further, FIG. 8 also includes conductive segments of a word line 816 that provide integrally formed gates for the vertically oriented FETs 802. The trench layer of $SiO_2$ 150 includes the trench layer of $SiO_2$ described and explained above in connection with FIGS. 1–5. The trench layer of $SiO_2$ 150 is an oxide layer formed between the word line 816 and the body region 810 of trench devices 802a and 802b. FIG. 8 also includes the top layer of $SiO_2$ 140 which includes the top layer of $SiO_2$ described and explained in detail in connection with FIGS. 1–5.

Figure 9:
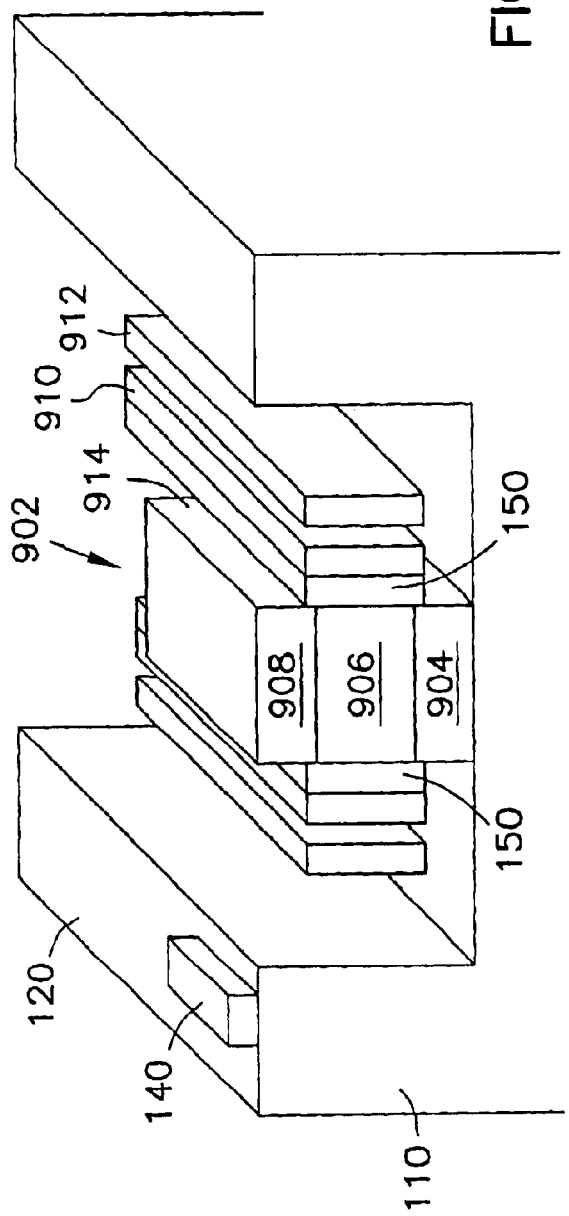
FIG. 9 is a perspective view illustrating an embodiment of a portion of non-volatile memory used in conjunction with embodiments of the present invention.

FIG. 9 is an alternative embodiment of vertical transistors used in conjunction with embodiments of the present invention. In one embodiment, portions of the trench devices illustrated and described in conjunction with FIGS. 1–5 are vertical transistors of a memory cell.

FIG. 9 is a perspective view illustrating generally one embodiment of a portion of a non-volatile memory formed in conjunction with embodiments of the present invention. Those of ordinary skill in the art will appreciate that FIG. 9 may include other components, including top surface devices (not shown). FIG. 9 illustrates portions of a non-volatile memory cell 902 formed in conjunction with embodiments of the present invention. In one embodiment, the non-volatile memory cell 902 is a vertically oriented FET. In one embodiment, the non-volatile memory cell 902 is a portion of an EEPROM, flash memory or NVRAM devices, which include a trench layer of $SiO_2$ or tunnel oxide layer formed according to the teachings of the present invention.

FIG. 9 includes an n+ silicon layer formed on a silicon wafer 110 to produce a first source/drain region 904. A p– silicon layer is formed on the first source/drain region 904 to form a body region 906. Additionally, the non-volatile memory cell 902 include an n+ silicon layer formed on the p– body region 906 to produce a second source/drain region 908.

Additionally, FIG. 9 includes a floating gate 910 and a control gate 912. The trench layer of $SiO_2$ 150 includes the trench layer of SiO₂ formed on a trench surface 914, described and explained above in connection with FIGS. 1–5. The trench layer of SiO₂ 150 is an oxide layer formed between the word line floating gate 910 and the body region 906 of the non-volatile memory cell 902. FIG. 9 also includes the top layer of SiO₂ 140 which includes the top layer of SiO₂ formed on a top surface 120, described and explained in detail in connection with FIGS. 1–5.

The device of FIG. 9 encompasses embodiments wherein the crystal planes of the top surface 120 and the trench surface 914 are specifically oriented to allow for a higher oxidation rate for oxides layers grown on the top surface 120. Accordingly, when oxide layers are grown on both the top surface 120 and the trench surface 914 during a same linear growth period, oxide layers grown on the trench surface 914 are thinner than oxide layers grown on the top surface 120. In one such embodiment, the top surface 120 has a (110) crystal plane orientation while the trench surface 914 has a (100) crystal plane orientation. In another such embodiment, the top surface 120 has a (111) crystal plane orientation, while the trench surface has a (110) crystal plane orientation. Advantageously, thinner oxides on the trench walls and thicker oxides on top surfaces prove particularly useful in conjunction with EEPROM devices, flash memory devices or other NVRAM devices. In particular, the tunnel oxides along the trench walls used with such devices should be as thin as possible, while the logic devices residing on the top surfaces should have thicker oxides to ensure reliability.

Figure 10:
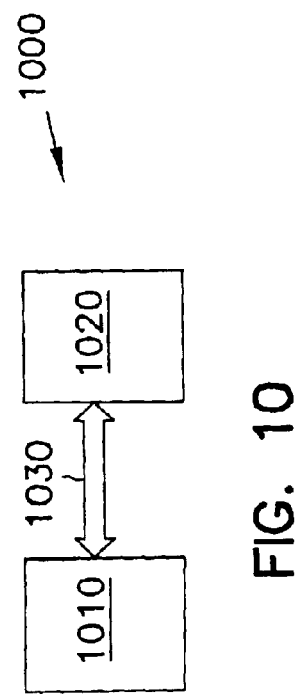
FIG. 10 is a block diagram which illustrates an embodiment of a system according to teachings of the present invention.

FIG. 10 is a block diagram which illustrates an embodiment of a system 1000 according to teachings of the present invention. The system 1000 includes an integrated circuit 1010. The integrated circuit 1010 includes the embodiments of top and trench devices formed with specific crystalline plane orientations to facilitate formation of differing gate oxide thicknesses in a streamlined fabrication process flow according to the teachings of the present invention. Additionally, the system 1000 includes a processor 1020 that is operatively coupled to the integrated circuit 1010. The processor 1020 is coupled to the integrated circuit 1010 through a system bus 1030. In one embodiment, the processor 1020 and the integrated circuit 1010 are on the same semiconductor chip.

CONCLUSION

Thus, improved methods and structures are provided for multiple oxide thickness on a single silicon wafer. In particular, improved methods and structures are provided for multiple gate oxide thickness on a single chip wherein the chip can include circuitry encompassing a range of technologies including but not limited to the memory and logic technologies. Moreover, these improved methods and structures for multiple oxide thickness on a single silicon wafer can be used in conjunction with existing fabrication and processing techniques with minimal or no added complexity.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method comprising:
    forming a top layer of SiO₂ on a top surface of a silicon wafer, wherein the top surface has a (100) crystal plane orientation, such that the top layer has a top thickness; and
    forming a trench layer of SiO₂ on a trench wall of the silicon wafer, wherein the trench wall has a (110) crystal plane orientation, such that the trench layer has a trench thickness that is different from the top thickness.

2. The method of claim 1, wherein forming the trench layer of SiO₂ includes forming the trench layer of SiO₂ that has a thickness that is approximately 30% thicker than the top layer of SiO₂.

3. The method of claim 1, wherein forming the top layer of SiO₂ includes forming the top layer as a gate oxide of a logic device.

4. The method of claim 3, wherein forming the top layer of SiO₂ includes forming the logic device wherein the logic device has an operating voltage of less than 2.5 volts.

5. The method of claim 1, wherein forming the trench layer of SiO₂ includes forming the trench layer as a gate oxide of a DRAM cell.

6. The method of claim 5, wherein forming the trench layer of SiO₂ includes forming the DRAM cell wherein the DRAM cell has an operating voltage of less than 3.5 volts.

7. The method of claim 1, wherein forming the top layer of SiO₂ and forming the trench layer of SiO₂ includes forming the top layer of SiO₂ and fanning the trench layer of SiO₂ simultaneously during a linear growth period.

8. The method of claim 1, wherein forming the top layer of SiO₂ includes forming the top layer as a gate oxide of a logic device, and wherein forming the trench layer of SiO₂ includes forming the trench layer as a gate oxide of a DRAM cell.

9. The method of claim 1, wherein forming the top layer of SiO₂ includes forming the top layer as a gate oxide of a logic device, wherein the logic device has an operating voltage of less than 2.5 volts, and wherein forming the trench layer of SiO₂ includes forming a trench layer as a gate oxide of a DRAM cell, wherein the DRAM cell has an operating voltage of less than 3.5 volts.

10. A method comprising:
    forming a top device on a top surface of a silicon wafer, wherein the top surface has a (100) crystal plane orientation and the top device includes a top gate separated from the top surface by a top gate oxide; and
    forming a trench device on a trench wall of a trench in the silicon wafer, wherein the trench wall has a (110) crystal plane orientation and the trench device includes a trench gate separated from the trench wall by a trench gate oxide, such that a thickness of the top gate oxide is different from a thickness of the trench gate oxide.

11. The method of claim 10, wherein forming the top device includes wet oxidizing the top surface at a temperature of approximately 800° C.

12. The method of claim 10, wherein forming the trench device includes wet oxidizing the trench surface at a temperature of approximately 800° C.

13. The method of claim 10, wherein forming the top device and forming the trench device includes simultaneously forming the top gate oxide and the trench gate oxide during a linear growth period.

14. The method of claim 10, wherein forming the top gate oxide includes forming the top gate oxide as a gate oxide of a logic device.

15. The method of claim 10, wherein forming the trench gate oxide includes forming the trench gate oxide as a gate oxide of a DRAM cell.

16. A method comprising:
forming a top device on a top surface of a silicon wafer, wherein the top surface has a (100) crystal plane orientation and wherein the top device includes a top gate separated from the top surface by a thermally formed top gate oxide;
forming a trench in the silicon wafer such that a trench wall forms with a (110) crystal plane orientation; and
forming a trench device on the trench wall, the trench device including a trench gate separated from the trench wall by a thermally formed trench gate oxide, wherein the top gate oxide has a thickness which is different from a thickness of the trench gate oxide.

17. The method of claim 16, wherein forming the top device on the top surface of the silicon wafer includes forming the thickness of the top gate oxide to approximately 70 Angstroms, and wherein forming the trench device on the trench wall of the trench includes forming the thickness of the trench gate oxide to approximately 100 Angstroms.

18. The method of claim 16, wherein the top surface and the trench wall are formed by simultaneous thermal oxidation, and where the thermal oxidation is selected from wet oxidation and dry oxidation.

19. The method of claim 16, wherein forming the top device and forming the trench device includes simultaneously forming the top gate oxide and the trench gate oxide during a linear growth period.

20. The method of claim 16, the method further including:
forming a stacked capacitor DRAM (Dynamic Random Access Memory) cell in the trench.

21. A method comprising:
forming a top layer of $SiO_2$ on a top surface of a silicon wafer, wherein the top surface has a (111) crystal plane orientation, such that the top layer has a top thickness; and
forming a trench layer of $SiO_2$ on a trench wall of the silicon wafer, wherein the trench wall has a (110) crystal plane orientation, such that the trench layer has a trench thickness that is different from the top thickness of the top layer.

22. The method of claim 21, wherein forming the trench layer of $SiO_2$ on the trench wall includes forming the trench layer of $SiO_2$ that has a thickness that is approximately 30% thicker than a thickness of the top layer of $SiO_2$.

23. The method of claim 21, wherein forming the top layer of $SiO_2$ and forming the trench layer of $SiO_2$ includes forming the top layer of $SiO_2$ and forming the trench layer of $SiO_2$ simultaneously during a linear growth period.

24. The method of claim 21, the method further including:
forming an NVRAM (Non-Volatile Random Access Memory) device at the trench layer of $SiO_2$.

25. The method of claim 21, the method further including:
forming a floating gate device at the trench layer of $SiO_2$.

26. A method comprising:
forming a top surface of a silicon wafer with a (111) crystalline plane orientation;
forming a trench in the silicon wafer, wherein a trench wall has a (110) crystalline plane orientation; and
simultaneously forming a top oxide layer on the top surface and forming a trench oxide layer on the trench wall, during a linear growth period, wherein the top oxide layer has a different thickness than the trench oxide layer.

27. The method of claim 26, wherein simultaneously forming the top oxide layer on the top surface and forming the trench oxide layer on the trench wall includes dry oxidizing the top surface at a temperature of approximately 800° C.

28. The method of claim 26, the method further including:
forming a floating gate device at the trench oxide layer.

29. The method of claim 26, the method further including:
forming a floating gate at the trench oxide layer; and
forming a control gate at the floating gate.

30. A method comprising:
forming a top layer of $SiO_2$ on a top surface of a silicon wafer, wherein the top surface has a (111) crystalline orientation, such that the top layer has a top thickness; and
forming a trench layer of $SiO_2$ on a trench wall of the silicon wafer, wherein the trench wall has a (110) crystalline orientation, such that the trench layer has a trench thickness that is different from the top thickness of the top layer, wherein forming the top layer of $SiO_2$ and forming the trench layer of $SiO_2$ includes forming the top layer of $SiO_2$ and forming the trench layer of $SiO_2$ simultaneously during a linear growth period, and wherein forming the trench layer of $SiO_2$ on the trench wall includes forming the trench layer of $SiO_2$ that has a thickness that is approximately 30% thicker than a thickness of the top layer of $SiO_2$.

31. The method according to claim 30, the method further including:
forming a CMOS logic circuit that includes the top layer of $SiO_2$ on the top surface of the silicon wafer.

32. The method according to claim 30, the method further including:
forming a CMOS logic circuit that includes the top layer of $SiO_2$ on the top surface of the silicon wafer; and
forming a NVRAM (non-volatile random access memory) device on the trench layer of $SiO_2$.

33. A method comprising:
forming a logic device on a top surface of a silicon wafer, wherein the top surface has a (100) crystal plane orientation and wherein the logic device includes a logic gate separated from the top surface by a logic gate oxide; and
forming an EEPROM (Electronically Erasable Programmable Read Only Memory) device on a trench wall of the silicon wafer, wherein the trench wall has a different order plane-orientation than the top surface and wherein the EEPROM device includes an EEPROM gate separated from the trench wall by an EEPROM gate oxide, wherein the logic gate oxide has a thickness which is different from a thickness of the EEPROM gate oxide.

34. The method of claim 33, the method further including:
forming a programmable logic array that includes the logic device and the EEPROM.

35. The method of claim 1, wherein forming the top layer and forming the trench layer includes forming the trench layer to a thickness that is thicker than the top layer.

36. The method of claim 1, wherein forming the top layer and forming the trench layer includes forming the trench layer to a thickness that is about 100 Angstroms thick.

37. The method of claim 1, wherein forming the top layer of $SiO_2$ and forming the trench layer of $SiO_2$ includes forming the top layer of SiO$_2$ and forming the trench layer of SiO$_2$ simultaneously during a linear growth period, and wherein fanning the top layer includes wet oxidizing the top surface at a temperature of approximately 800° C.

38. The method of claim 1, wherein forming the top layer of SiO$_2$ and forming the trench layer of SiO$_2$ includes forming the top layer of SiO$_2$ and forming the trench layer of SiO$_2$ simultaneously during a linear growth period, and wherein forming the trench layer includes wet oxidizing the trench wall at a temperature of approximately 800° C.

39. The method of claim 1, wherein forming the top layer includes wet oxidizing the top surface at a temperature of approximately 800° C.

40. The method of claim 1, wherein forming the trench layer includes wet oxidizing the trench wall at a temperature of approximately 800° C.

41. The method of claim 1, wherein forming the top layer includes dry oxidizing the top surface at a temperature of approximately 800° C.

42. The method of claim 1, wherein forming the trench layer includes dry oxidizing the trench wall at a temperature of approximately 800° C.

43. The method of claim 1, wherein forming the top layer on the top surface of the silicon wafer includes forming the thickness of the top layer to approximately 70 Angstroms.

44. The method of claim 1, wherein forming the top layer on the top surface of the silicon wafer includes forming the thickness of the top layer to approximately 70 Angstroms, and wherein forming the trench device on the trench wall of the trench includes forming the thickness of the trench layer to approximately 100 Angstroms.

\* \* \* \* \*

UNITED STATES PATENT AND TRADEMARK OFFICE
CERTIFICATE OF CORRECTION

PATENT NO. : 6,887,749 B2
DATED : May 3, 2005
INVENTOR(S) : Noble et al.

It is certified that error appears in the above-identified patent and that said Letters Patent is hereby corrected as shown below:

Column 16,
Line 33, delete "fanning" and insert -- forming --, therefor.

Column 19,
Line 3, delete "fanning" and insert -- forming --, therefor.

Signed and Sealed this

Second Day of August, 2005

JON W. DUDAS
*Director of the United States Patent and Trademark Office*